United States Patent [19]
Bulat et al.

[11] Patent Number: 5,192,699
[45] Date of Patent: Mar. 9, 1993

[54] METHOD OF FABRICATING FIELD EFFECT TRANSISTORS

[75] Inventors: Emel S. Bulat; Maureen Sullivan, both of Framingham, Mass.

[73] Assignee: GTE Laboratories Incorporated, Waltham, Mass.

[21] Appl. No.: 628,763

[22] Filed: Dec. 17, 1990

[51] Int. Cl.⁵ .......................................... H01L 21/265
[52] U.S. Cl. .................................... 437/41; 437/911; 437/978
[58] Field of Search ................. 437/911, 978, 41; 148/DIG. 88

[56] References Cited

U.S. PATENT DOCUMENTS

| | | | |
|---|---|---|---|
| 4,192,059 | 3/1980 | Khan et al. | 437/978 |
| 4,477,963 | 10/1984 | Cogan | 437/911 |
| 4,497,107 | 2/1985 | Cogan | 437/911 |
| 4,551,909 | 11/1985 | Cogan et al. | 437/29 |
| 4,983,536 | 1/1991 | Bulat et al. | 437/911 |
| 4,996,167 | 2/1991 | Chem | 437/978 |

Primary Examiner—Oiik Chaudhuri
Assistant Examiner—Long Pham
Attorney, Agent, or Firm—Victor F. Lohmann, III

[57] ABSTRACT

Method of fabricating a junction field effect transistor employing self-alignment techniques. The active regions of the device are defined by a relatively thin thermally-grown isolating silicon oxide layer at the surface of a silicon body. After the active source and gate regions of the device as defined by the thermally-grown isolatign silicon oxide are formed in the silicon, a layer of deposited silicon oxide is formed over the thermally-grown silicon oxide. This method provides a thick dielectric layer as well as control of the horizontal dimensions of the source and gate contacts.

7 Claims, 3 Drawing Sheets

METHOD OF FABRICATING FIELD EFFECT TRANSISTORS

BACKGROUND OF THE INVENTION

This invention relates to semiconductor devices. More particularly, it is concerned with methods of manufacturing junction field effect transistors of the static induction type.

The static induction transistor is a field effect semiconductor device capable of operation at relatively high frequency and power. The transistors are characterized by a short, high resistivity semiconductor channel region which may be controllably depleted of carriers. The current-voltage characteristics of the static induction transistor are generally similar to those of a vacuum tube triode.

The static induction transistor generally uses vertical geometry with source and drain electrodes placed on opposite sides of a thin, high resistivity layer of silicon of one conductivity type. Gate regions of the opposite conductivity type are positioned in the high resistivity layer on opposite sides of the source. During operation a reverse bias is applied between the gate regions and the remainder of the high resistivity layer causing a depletion region to extend into the channel region below the source. As the magnitude of the reverse bias is varied, the source-drain current and voltage derived from an attached energy source will also vary.

In surface gate static induction transistors, silicon oxide at the surface of the high resistivity layer isolates the alternating source and gate regions from each other. This silicon oxide should be of sufficient thickness to prevent excessive capacitance between the underlying silicon and overlying electrical connections. The silicon oxide is thermally grown by exposing silicon to oxygen while protecting the surface areas of the future source and gate regions with silicon nitride. During the thermal oxidation process, however, oxygen diffuses partially under the edges of the silicon nitride increasing the horizontal dimensions of the isolating silicon oxide and altering the horizontal dimensions of the source and gate surface areas from those which were defined by the silicon nitride. Thus, it is difficult to control, and therefore to reduce, the gate-to-gate distance, or pitch, which is critical in determining the operating characteristics of the device.

SUMMARY OF THE INVENTION

An improved method of fabricating a junction field effect transistor in accordance with the present invention comprises providing a body of silicon including a substrate of silicon of one conductivity type of relatively low resistivity and a layer of silicon of the one conductivity type of relatively high resistivity contiguous with the substrate. The layer has a surface at a surface of the body. A first layer of adherent, nonconductive, protective material is formed adherent at the surface and has openings therein exposing alternating source surface areas and gate surface areas. Conductivity type imparting material of the opposite conductivity type is introduced into the layer of silicon of the one conductivity type of relatively high resistivity from the gate surface areas to produce gate regions of the opposite conductivity type in the layer of silicon of the one conductivity type of relatively high resistivity at the gate surface areas. Conductivity type imparting material of the one conductivity type is introduced into the layer of silicon of the one conductivity type of relatively high resistivity from the source surface areas to produce source regions of the one conductivity type of lower resistivity in the layer of silicon of the one conductivity type of relatively high resistivity at said source surface areas. A second layer of adherent, nonconductive protective material is formed overlying the first layer of adherent, nonconductive, protective material leaving exposed the source surface areas and the gate surface areas. Conductive material is applied to form source and gate contacts in ohmic contact with the source and gate regions, respectively.

In another aspect of the invention a junction field effect transistor is fabricated by the method comprising providing a body of silicon including a substrate of silicon of one conductivity type of relatively low resistivity and a layer of silicon of the one conductivity type of relatively high resistivity contiguous with the substrate. The layer has a surface at a surface of the body. The surface is covered with a protective masking material and portions of the protective masking material are removed to expose selected areas of the surface. The body is exposed to oxygen at an elevated temperature to convert the exposed silicon at the selected areas to silicon oxide thereby forming a first layer of thermally-grown silicon oxide having openings therein at alternating source surface areas and gate surface areas. The protective masking material is removed to expose the alternating source surface areas and gate surface areas. Conductivity type imparting material of the opposite conductivity type is introduced into the layer of silicon of the one conductivity type of relative high resistivity from the gate surface areas to produce gate regions of the opposite conductivity type in the layer of silicon of the one conductivity type of relatively high resistivity at the gate surface areas. Conductivity type imparting material of the one conductivity type is introduced into the layer of silicon of the one conductivity type of relatively high resistivity from the source surface areas to produce source regions of the one conductivity type of lower resistivity in the layer of silicon of the one conductivity type of relatively high resistivity at the source surface areas. A layer of silicon oxide is deposited. The deposited layer of silicon oxide is covered with masking material and portions of the masking material are selectively removed to expose the portions of the deposited layer of silicon oxide which overlie the source and gate surface areas and to leave remaining portions of the masking material covering the portions of the deposited layer of silicon oxide which overlie the first layer of thermally-grown silicon oxide. The body is treated to etch away the exposed portions of the deposited layer of silicon oxide to expose the source and gate surface areas and form a second layer of deposited silicon oxide which overlies the first layer of thermally-grown silicon oxide. Conductive material is applied to form source and gate contacts in ohmic contact with the source and gate regions, respectively.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following disclosure and appended claims in connection with the abovedescribed drawings.

DETAILED DESCRIPTION OF THE INVENTION

In fabricating junction field effect transistors of the static induction type in accordance with the present invention as illustrated in the figures, a substrate of single crystal silicon of one conductivity type is provided as a supporting structure. As is well understood, the substrate is usually a slice or wafer of relatively large surface area. For purposes of illustration, however, the fabrication of only a portion of a single static induction transistor in a fragment of a slice will be shown and described.

Figure 1:
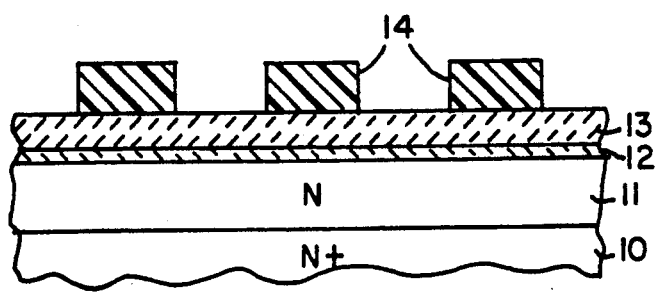
FIGS. 1-12 are a series of elevational views in crosssection of a fragment of a wafer of silicon illustrating successive stages in the fabrication of a junction field effect transistor of the static induction type in accordance with the present invention.

A slice or wafer of N-type silicon of uniform, relatively low resistivity having flat, planar, parallel, opposed major surfaces, a fragment 10 of which is shown in FIG. 1, is produced by any of the known techniques of crystal fabrication including appropriate slicing and cleaning operations. An epitaxial layer 11 of relatively high resistivity N-type conductivity which is precisely controlled as to thickness and as to resistivity and which is a continuation of the crystalline structure of the single crystal substrate 10 is then grown on the surface of the substrate. The upper surface of the epitaxial layer 11 is parallel to the interface between the substrate and the layer.

Figure 2:
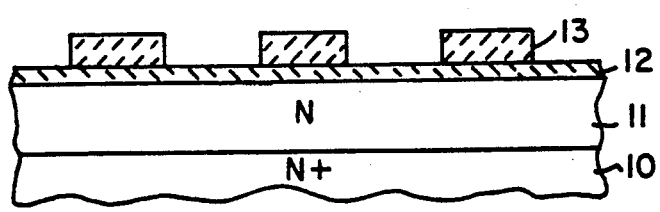

A thin layer of silicon oxide 12 is grown on the surface of the epitaxial layer 11 and a layer of silicon nitride 13 is deposited on the silicon oxide layer. The silicon nitride layer 13 is then covered with a layer of photoresist material 14. By employing known photolithographic techniques portions of the photoresist layer 14 are removed to expose the surface of the silicon nitride layer 13 in a pattern of elongated parallel areas which define the pattern of the source and gate regions of the device. The silicon nitride layer 13 is etched employing known plasma etching techniques and then the remaining photoresist 14 is removed (FIG. 2).

Figure 3:
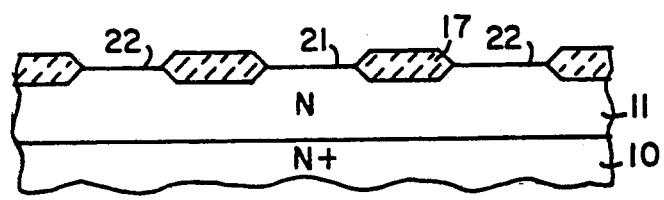

The wafer is then exposed to oxygen at an elevated temperature to produce a relatively thin, thermally-grown isolating silicon oxide layer 17 in the exposed elongated areas between the elongated strips of silicon nitride 13, as illustrated in FIG. 3. As is well-understood, the exposed silicon at the surface is converted to silicon oxide by the presence of the oxygen in the atmosphere to form the layer 17. During this treatment oxygen diffuses partially under the edges of the silicon nitride mask increasing the horizontal dimensions of the silicon oxide 17. By making the silicon oxide layer 17 relatively thin, between 4,000 and 7,500 angstroms, the amount of undercutting of the mask 12-13 and thus the horizontal widening of the isolating silicon oxide layer 17 is small.

The remaining silicon nitride layer 13 is removed by treating in a suitable etching solution. The resulting wafer as illustrated in FIG. 3 includes protective layers of thin, thermally-grown silicon oxide 17 between exposed surface areas. The surface areas are alternately source surface areas 21 and gate surface areas 22.

Figure 4:
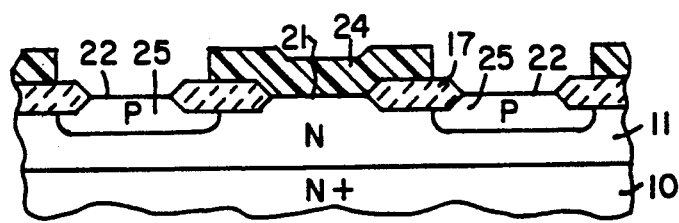

As illustrated in FIG. 4 the source surface areas 21 are protected with a layer of photoresist material 24 so that only the gate surface areas 22 remain exposed. P-type conductivity imparting material, for example boron, is then introduced into the wafer at the exposed gate surface areas 22 by conventional ion implantation techniques. The protective photoresist material 24 is removed, and the wafer is heated to cause the implanted P-type conductivity imparting material to diffuse into the epitaxial layer 11 from the gate surface areas 22. As a result of the ion implantation and subsequent heating, gate regions 25 of P-type conductivity are produced inset in the high resistivity N-type material of the epitaxial layer 11.

Figure 5:
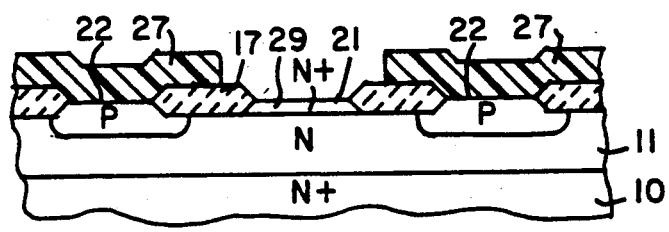
Figure 6:
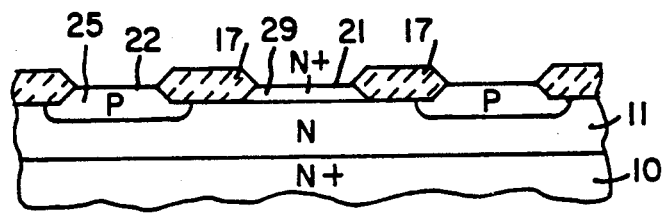

The photoresist material 24 is removed and the gate surface areas 22 are appropriately protected by photoresist material 27 (FIG. 5). A shallow, heavily-doped N-type source region 29 is formed at each of the source surface areas 21 by ion implantation of arsenic as illustrated in FIG. 5. The photoresist material 27 is removed from the gate surface areas and the wafer is annealed in order to activate the implanted ions of the source regions 29. The wafer at this stage is illustrated in FIG. 6.

Figure 7:
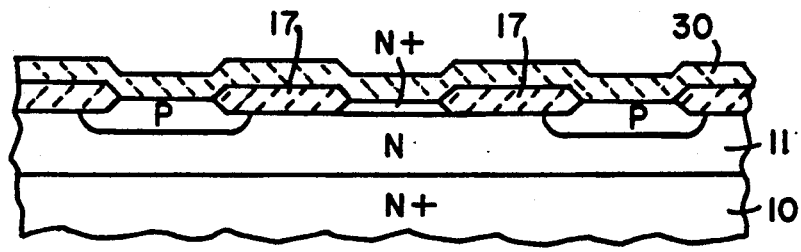
Figure 8:
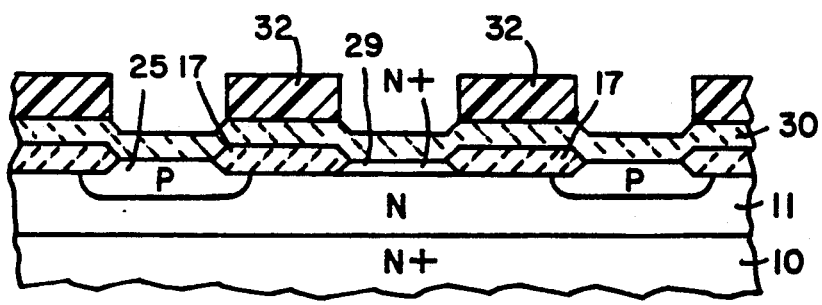

Next, as illustrated in FIG. 7 a layer of silicon oxide 30 is deposited over the surface of the wafer. The deposited silicon oxide 30 is placed on the wafer by employing conventional low pressure chemical vapor deposition procedures. The deposited silicon oxide layer 30 may be any thickness desired, 3,000 to 7,000 angstroms having been found practical. The layer of deposited silicon oxide 30 is covered with a photoresist material 32, portions of which are selectively removed in accordance with known processes to leave openings which overlie the source and drain regions 29 and 25, respectively. (FIG. 8.) The photoresist material 32 remains over the portions of the deposited silicon oxide layer 30 which overlie the thermally-grown silicon oxide 17 between the source and gate regions.

Figure 9:
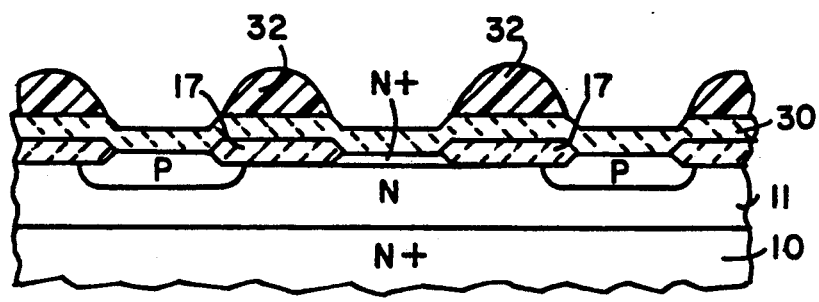

The wafer is then treated to cause the portions of the photoresist material 32 overlying the thermally-grown silicon oxide 17 to become rounded, or to become tapered, at the edges. (FIG. 9.) That is, each of the portions of the photoresist material 32 is reduced in thickness at its edges so that at the edges it is thinner than in its central portion. More specifically, a novolak based photoresist material may be employed. The thickness of the photoresist material is 10,000 to 12,000 angstroms. The wafer is baked at a temperature of from 150° to 185° C., specifically 170° C. on a flat plate in a standard convection oven for from 5 to 40 minutes to produce the desired configuration.

Figure 10:
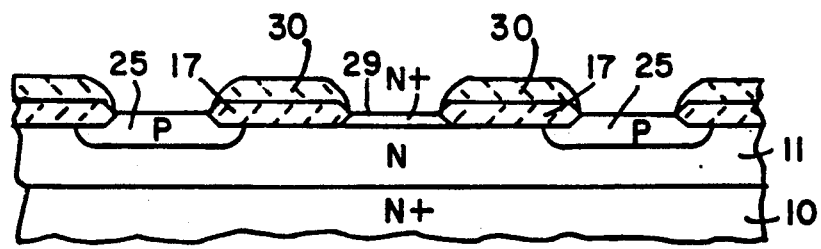

Next the wafer is subjected to reactive ion plasma etching to remove materials from the upper surface by equal amounts. By virtue of the configuration of the photoresist material 32 there is reduced protection for the deposited silicon oxide 30 in the regions adjacent to the edges of the photoresist 32 and no protection for the exposed silicon oxide 30 overlying the source and gate regions 29 and 25, respectively. (FIG. 9.) As a result, as illustrated in FIG. 10, the deposited silicon oxide 30 is totally removed from over the source and gate regions 29 and 25, respectively. The remaining portions of the deposited silicon oxide layer 30 overlying the thermally-grown silicon oxide 17 are rounded at the edges, or tapered, so that they are thinner at the edges than in the central portions.

Figure 11:
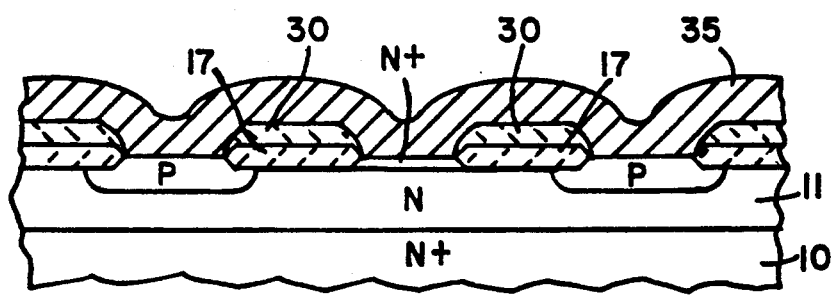
Figure 12:
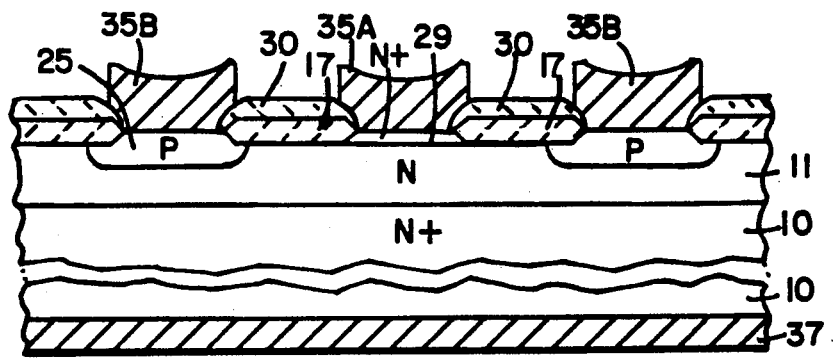

The wafer is then treated in accordance with known procedures to produce ohmic contact members to the source and gate regions. A layer of titanium-tungsten alloy (Ti/W) is deposited over the entire wafer followed by a layer of aluminum (Al) 35. (FIG. 11.) Photoresist material is applied over the Ti/W-Al metallization 35. The photoresist material is removed except over the source and gate regions 29 and 25. The wafer is treated to etch away the exposed aluminum and then the underlying exposed titanium-tungsten alloy. The resulting source and gate contact members 35A and 35B as illustrated in FIG. 12 are in direct ohmic contact with the source and gate regions 29 and 25 at the source and gate surface areas, respectively. The source contact members 35A are appropriately connected together and to a source bonding pad (not shown), and the gate contact members 35B are appropriately connected together and to a gate bonding pad (not shown) in a conventional manner. A metal layer 37 is applied to the bottom surface of the substrate 10 in order to provide a suitable drain contact member.

The method as described employs relatively thin thermally-grown isolating silicon oxide to establish the dimensions of the active source and gate regions of the device. Since a thinner silicon oxide is grown, undercutting of the silicon nitride mask which defines the dimensions of the thermally-grown isolating silicon oxide is reduced. Thus, greater control of the lateral dimensions of the device structure is obtained than was heretofore possible. With increased control of the lateral dimensions, the pitch (gate-to-gate spacing) can be reduced providing improved device characteristics. In addition, the surface areas of the source and gate regions for devices of the same pitch are larger, providing larger area ohmic contacts to the source and gate regions and, therefore, improved electrical characteristics and device reliability. This two-level silicon oxide method provides these advantages while permitting the silicon oxide dielectric which separates the metallic connections from the underlying silicon in the vertical direction to be as thick as necessary in order to keep device capacitance low. Furthermore, the rounded edges of the deposited silicon oxide eliminate abrupt steps in the structure, thus assuring that the deposited metal contacts and connections are of adequate thickness throughout.

While there has been shown and described what is considered a preferred embodiment of the present invention, it will be obvious to those skilled in the art that various changes and modifications may be made therein without departing from the invention as defined by the appended claims.

what is claimed is:

1. The method of fabricating a junction field effect transistor comprising
    providing a body of silicon including a substrate of silicon of one conductivity type of relatively low resistivity and a layer of silicon of the one conductivity type of relatively high resistivity contiguous with said substrate, said layer having a surface at a surface of the body;
    forming a first layer of adherent, nonconductive, protective material adherent at said surface having openings therein exposing alternating source surface areas and gate surface areas with nonconductive, protective material of said first layer between adjacent source and gate surface areas and isolating adjacent source and gate surface areas from each other;
    introducing conductivity type imparting material of the opposite conductivity type into said layer of silicon of the one conductivity type of relatively high resistivity from said gate surface areas to produce gate regions of the opposite conductivity type in said layer of silicon of the one conductivity type of relatively high resistivity at said gate surface areas;
    introducing conductivity type imparting material of the one conductivity type into said layer of silicon of the one conductivity type of relatively high resistivity from said source surface areas to produce source regions of the one conductivity type of lower resistivity in said layer of silicon of the one conductivity type of relatively high resistivity at said source surface areas;
    forming a second layer of adherent, nonconductive, protective material overlying the nonconductive, protective material of said first layer of adherent, nonconductive, protective material between adjacent source and gate surface areas and leaving exposed said source surface areas and said gate surface areas with nonconductive, protective material of said first layer and nonconductive, protective material of said second layer between adjacent source and gate surface areas and isolating adjacent source and gate regions from each other; and
    applying conductive material to form source and gate contacts in ohmic contact with the source and gate regions, respectively.

2. The method in accordance with claim 1 wherein forming a first layer of adherent, nonconductive, protective material includes
    placing a layer of protective masking material on said surface to expose selected areas of said surface; and
    exposing the body to oxygen at an elevated temperature to convert exposed silicon at said selected areas to silicon oxide thereby forming a first layer of thermally-grown silicon oxide having openings therein at said source surface areas and said gate surface areas with thermally-grown silicon oxide of said first layer between adjacent source and gate surface areas and isolating adjacent source and gate surface areas from each other.

3. The method in accordance with claim 2 wherein forming a second layer of adherent, nonconductive, protective material includes
    depositing silicon oxide to form a second layer of silicon oxide overlying said first thermally-grown layer of silicon oxide.

4. The method of fabricating a junction field effect transistor comprising
    providing a body of silicon including a substrate of silicon of one conductivity type of relatively low resistivity and a layer of silicon of the one conductivity type of relatively high resistivity contiguous with said substrate, said layer having a surface at a surface of the body;
    covering said surface with a protective masking material;
    removing portions of said protective masking material to expose selected areas of said surface;
    exposing said body to oxygen at an elevated temperature to convert exposed silicon at said selected areas to silicon oxide thereby forming a first layer of thermally-grown silicon oxide having openings therein at alternating source surface areas and gate surface areas with silicon oxide of said first layer between adjacent source and gate surface areas and isolating adjacent source and gate surface areas from each other;

removing said protective masking material to expose said alternating source surface areas and gate surface areas;

introducing conductivity type imparting material of the opposite conductivity type into said layer of silicon of the one conductivity type of relatively high resistivity from said gate surface areas to produce gate regions of the opposite conductivity type in said layer of silicon of the one conductivity type of relatively high resistivity at said gate surface areas;

introducing conductivity type imparting material of the one conductivity type into said layer of silicon of the one conductivity type of relatively high resistivity from said source surface areas to produce source regions of the one conductivity type of lower resistivity in said layer of silicon of the one conductivity type of relatively high resistivity at said source surface areas;

depositing a layer of silicon oxide;

covering said deposited layer of silicon oxide with masking material;

selectively removing portions of said masking material to expose the portions of said deposited layer of silicon oxide overlying said source and gate surface areas and to leave remaining portions of the masking material covering the portions of said deposited layer of silicon oxide overlying the silicon oxide of said first layer of thermally-grown silicon oxide between adjacent source and gate surface areas;

treating said body to etch away the exposed portions of said deposited layer of silicon oxide to expose said source and gate surface areas and form a second layer of deposited silicon oxide overlying said first layer of thermally-grown silicon oxide between adjacent source and gate surface areas and isolating adjacent source and gate regions from each other; and applying conductive material to form source and gate contacts in ohmic contact with the source and gate regions, respectively.

5. The method in accordance with claim 4 wherein subsequent to selectively removing portions of said masking material and prior to treating said body to etch away the exposed portions of said deposited layer of silicon oxide treating said masking material to reduce the thickness of said remaining portions of the masking material at the edges thereof adjacent to the exposed portions of said deposited layer of silicon oxide.

6. The method in accordance with claim 5 wherein treating said body to etch away the exposed portions of said deposited layer of silicon oxide includes treating to etch all materials to an equal depth whereby each portion of the second layer of deposited silicon oxide overlying each portion of said first layer of thermally-grown silicon oxide is thinner at the edges thereof adjacent to the source and gate regions than in the center thereof.

7. The method in accordance with claim 6 wherein said first layer of thermally-grown silicon oxide is between 4,000 and 7,500 angstroms thick.

* * * * *